US012787855B2

(12) United States Patent
Tabakoya et al.

(10) Patent No.: US 12,787,855 B2
(45) Date of Patent: Nov. 3, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Taira Tabakoya, Tokyo (JP); Toshihiro Tsujimura, Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 382 days.

(21) Appl. No.: 18/627,980

(22) Filed: Apr. 5, 2024

(65) Prior Publication Data

US 2025/0105067 A1 Mar. 27, 2025

(30) Foreign Application Priority Data

Sep. 21, 2023 (JP) ................................ 2023-156414

(51) Int. Cl.

| | |
|---|---|
| ***H10W 76/12*** | (2026.01) |
| ***H10W 70/60*** | (2026.01) |
| ***H10W 70/65*** | (2026.01) |
| ***H10W 72/30*** | (2026.01) |
| ***H10W 74/10*** | (2026.01) |
| ***H10W 90/00*** | (2026.01) |

(52) U.S. Cl.

CPC ........... *H10W 76/12* (2026.01); *H10W 70/65* (2026.01); *H10W 90/736* (2026.01)

(58) Field of Classification Search

CPC . H10W 70/611; H10W 70/60; H10W 90/401; H10W 90/736; H10W 74/114; H10W 74/111; H10W 72/30

See application file for complete search history.

(56) References Cited

U.S. PATENT DOCUMENTS

| | | | | |
|---|---|---|---|---|
| 11,276,627 | B2 | 3/2022 | Kawashima et al. | |
| 11,430,717 | B2 | 8/2022 | Kawashima | |
| 2020/0365490 | A1 * | 11/2020 | Kawashima .......... | H10W 70/20 |

FOREIGN PATENT DOCUMENTS

| | | | |
|---|---|---|---|
| JP | 2020-188169 | A | 11/2020 |
| JP | 2020-188172 | A | 11/2020 |
| JP | 7172847 | B2 | 11/2022 |

* cited by examiner

*Primary Examiner* — Antonio B Crite

(74) *Attorney, Agent, or Firm* — Kim & Stewart LLP

(57) ABSTRACT

A semiconductor device includes a first substrate, a second substrate, a first semiconductor element, a second semiconductor element, a connection conductor, a connection conductor, and a sealing part. The first substrate includes a first surface, a second surface, a first insulating substrate, and a first conductive layer. The second substrate includes a third surface, a fourth surface, a second insulating substrate, and a second conductive layer. The first semiconductor element includes a first semiconductor layer, a first electrode, a second electrode, and a first control electrode. The second semiconductor element includes a second semiconductor layer, a third electrode, a fourth electrode, and a second control electrode. The connection conductor electrically connects the first and fourth electrodes. The sealing part covers a portion of the first substrate, a portion of the second substrate, the first semiconductor element, and the second semiconductor element.

7 Claims, 5 Drawing Sheets

SEMICONDUCTOR DEVICE

CROSS-REFERENCE TO RELATED APPLICATIONS

This application is based upon and claims the benefit of priority from Japanese Patent Application No. 2023-156414, filed on Sep. 21, 2023; the entire contents of which are incorporated herein by reference.

FIELD

Embodiments relate to a semiconductor device.

BACKGROUND

A semiconductor device has been developed in which multiple power semiconductor chips are connected to each other and sealed. For example, such a semiconductor device is used as a power module included as a portion of a power conversion circuit. It is desirable for the semiconductor device to be smaller.

DETAILED DESCRIPTION

Figure 1:
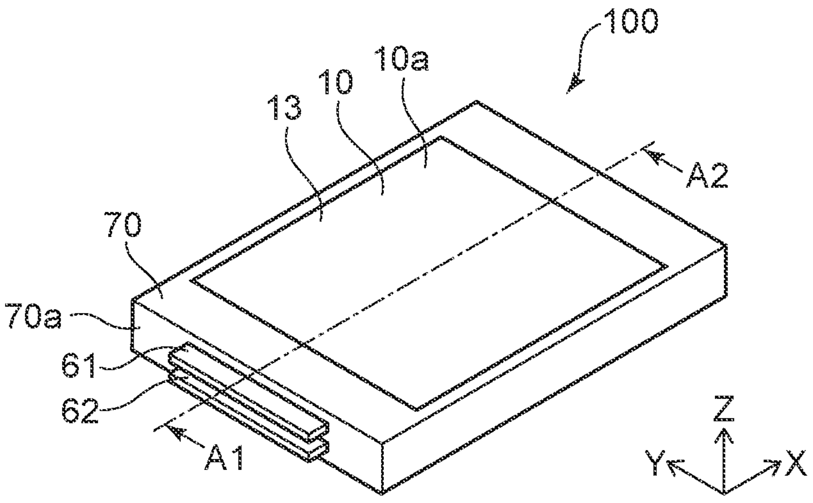
FIG. 1 is a schematic perspective view illustrating a semiconductor device according to an embodiment.

A semiconductor device according to one embodiment, includes a first substrate, a second substrate, a first semiconductor element, a second semiconductor element, a connection conductor, a connection conductor, and a sealing part. The first substrate includes a first surface, a second surface, a first insulating substrate, and a first conductive layer. The second surface is at a side opposite to the first surface. The first conductive layer is located at a front surface of the first insulating substrate and is positioned at the second surface. The second substrate includes a third surface, a fourth surface, a second insulating substrate, and a second conductive layer. The fourth surface is at a side opposite to the third surface. The second conductive layer is located at a front surface of the second insulating substrate and is positioned at the fourth surface. The first conductive layer is positioned between the first insulating substrate and the second insulating substrate in a first direction. The first direction is from the second substrate toward the first substrate. The second conductive layer is positioned between the first substrate and the second insulating substrate in the first direction. The first semiconductor element is located between the first substrate and the second substrate in the first direction. The first semiconductor element includes a first semiconductor layer, a first electrode, a second electrode, and a first control electrode. The first electrode is positioned between the first semiconductor layer and the second substrate in the first direction. The second electrode is located between the first semiconductor layer and the first substrate. The second electrode is electrically connected with a portion of the first conductive layer. The first control electrode is located between the first semiconductor layer and the first substrate. The first control electrode is electrically connected with another portion of the first conductive layer. The second semiconductor element is located between the second substrate and the first semiconductor element in the first direction. The second semiconductor element includes a second semiconductor layer, a third electrode, a fourth electrode, and a second control electrode. The third electrode is positioned between the second semiconductor layer and the second substrate. The third electrode is electrically connected with a portion of the second conductive layer. The fourth electrode is positioned between the second semiconductor layer and the first semiconductor element in the first direction. The second control electrode is positioned between the second semiconductor layer and the first semiconductor element in the first direction. The second control electrode is electrically connected with another portion of the second conductive layer. The connection conductor is located between the first semiconductor element and the second semiconductor element in the first direction. The connection conductor electrically connects the first and fourth electrodes. The sealing part covers a portion of the first substrate, a portion of the second substrate, the first semiconductor element, and the second semiconductor element. The sealing part does not cover the first surface of the first substrate and the third surface of the second substrate.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a schematic perspective view illustrating a semiconductor device according to an embodiment.

Figure 2:
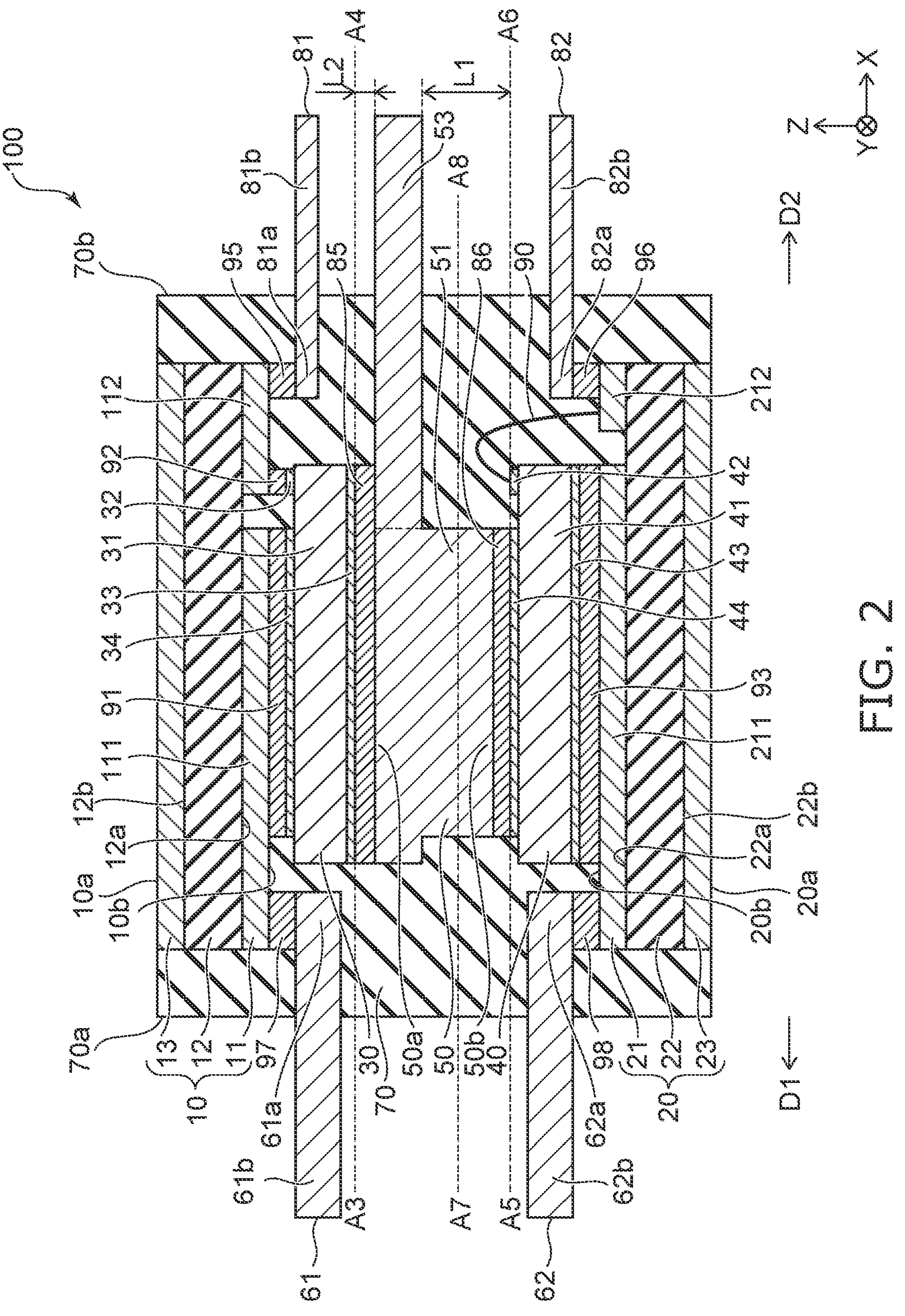
FIG. 2 is a schematic cross-sectional view illustrating the semiconductor device according to the embodiment.

FIG. 2 is a schematic cross-sectional view illustrating the semiconductor device according to the embodiment.

Figure 3:
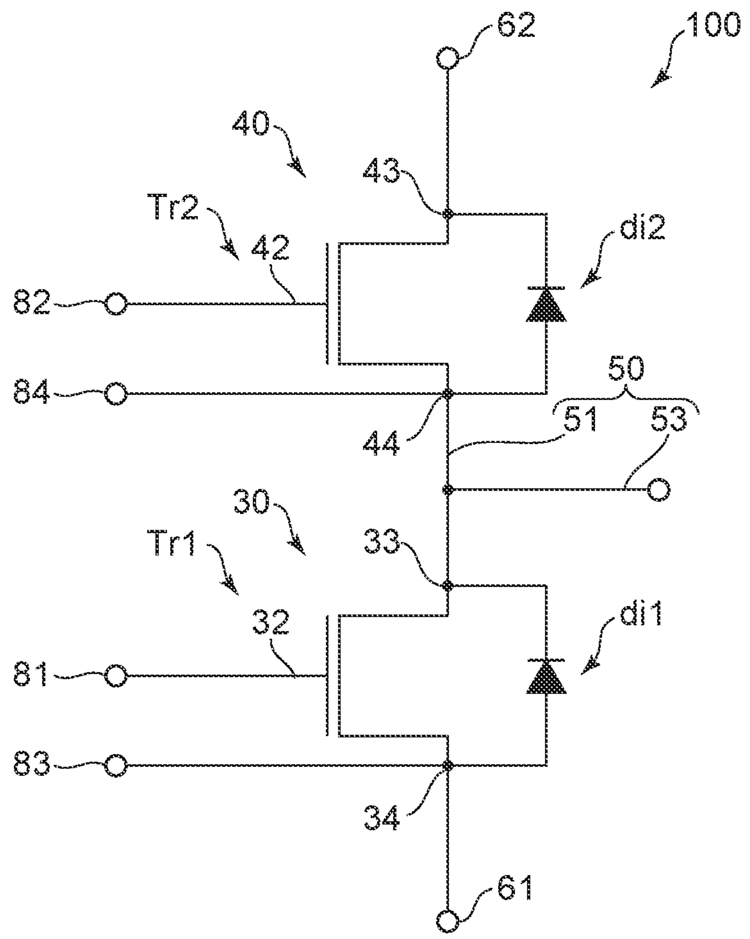
FIG. 3 is a schematic circuit diagram illustrating a circuit configuration of the semiconductor device according to the embodiment.

FIG. 3 is a schematic circuit diagram illustrating a circuit configuration of the semiconductor device according to the embodiment.

Figure 4:
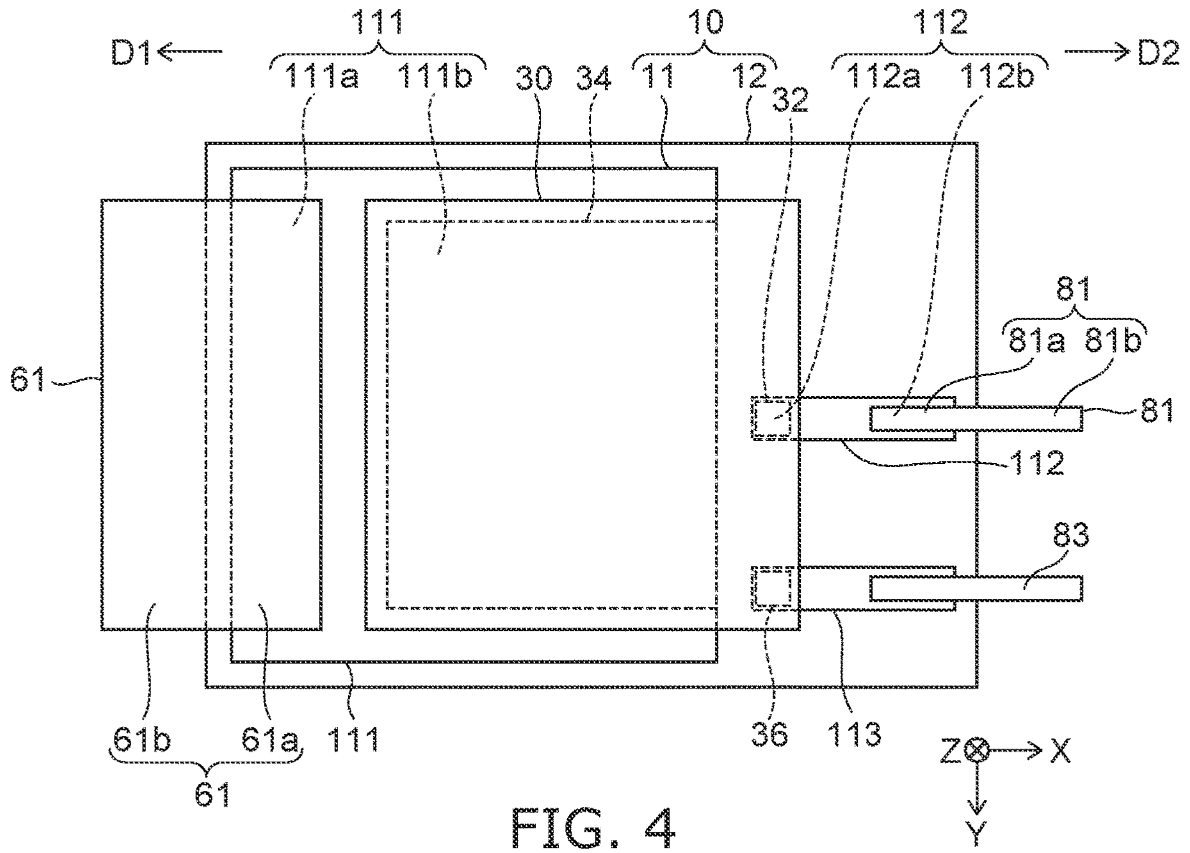
FIG. 4 is a schematic plan view illustrating a portion of the semiconductor device according to the embodiment.

FIG. 4 is a schematic plan view illustrating a portion of the semiconductor device according to the embodiment.

Figure 5:
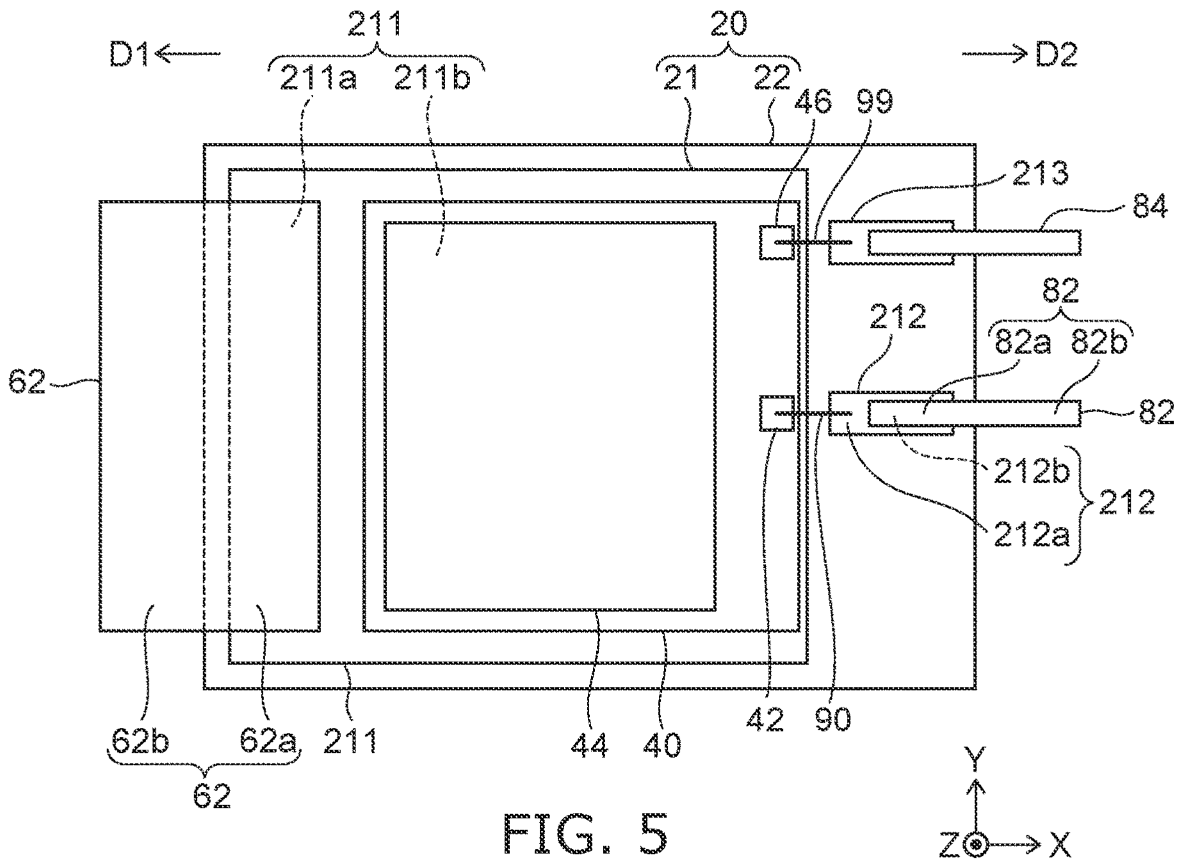
FIG. 5 is a schematic plan view illustrating a portion of the semiconductor device according to the embodiment.

FIG. 5 is a schematic plan view illustrating a portion of the semiconductor device according to the embodiment.

FIG. 2 illustrates a line A1-A2 cross section of the semiconductor device 100 illustrated in FIG. 1. As illustrated in FIG. 2, the semiconductor device 100 according to the embodiment includes a first substrate 10, a second substrate 20, a first semiconductor element 30, a second semiconductor element 40, a connection conductor 50, and a sealing part 70. FIG. 4 is a plan view of the portion of the semiconductor device 100 on the first substrate 10 side of line A3-A4 shown in FIG. 2, as viewed along a Z-direction shown in FIG. 2. FIG. 5 is a plan view of the portion of the semiconductor device 100 on the second substrate 20 side of line A5-A6 shown in FIG. 2, as viewed along the opposite direction of the Z-direction.

As illustrated in FIG. 2, the first substrate 10 includes a first surface 10*a*, and a second surface 10*b* at the side opposite to the first surface 10*a*. The first substrate 10 includes a first conductive layer 11 positioned at the second surface 10*b*, and a first insulating substrate 12. The first conductive layer 11 is located at a front surface 12*a* of the first insulating substrate 12.

The second substrate 20 includes a third surface 20*a*, and a fourth surface 20*b* at a side opposite to the third surface 20*a*. The second substrate 20 includes a second conductive layer 21 positioned at the fourth surface 20*b*, and a second insulating substrate 22. The second conductive layer 21 is located at a front surface 22*a* of the second insulating substrate 22.

In the description of the embodiment, the direction from the second substrate 20 toward the first substrate 10 is taken as the Z-direction (a first direction). A direction perpendicular to the Z-direction is taken as an X-direction. A direction perpendicular to the Z-direction and X-direction is taken as a Y-direction.

The first conductive layer 11 of the first substrate 10 is positioned between the first insulating substrate 12 and the second insulating substrate 22 in the Z-direction. The second conductive layer 21 of the second substrate 20 is positioned between the first conductive layer 11 and the second insulating substrate 22 in the Z-direction.

"A first component is between a second component and a third component in one direction" means, in other words, the position in the one direction of the first component is between the position in the one direction of the second component and the position in the one direction of the third component.

The first semiconductor element 30 is located between the first substrate 10 and the second substrate 20. The first semiconductor element 30 is, for example, a semiconductor component including a switching element. In the example, the first semiconductor element 30 is a power semiconductor chip including a vertical MOSFET (Metal-Oxide-Semiconductor Field-Effect Transistor). For example, the power semiconductor is used to control and convert power.

The first semiconductor element 30 includes a first semiconductor layer 31, a first control electrode 32, a first drain electrode 33 (a first electrode), and a first source electrode 34 (a second electrode). The first control electrode 32, the first drain electrode 33, and the first source electrode 34 are electrically connected respectively with a gate, a drain, and a source of a transistor formed in the first semiconductor layer 31.

The first control electrode 32 and the first source electrode 34 are electrode pads located at the front side of the first semiconductor layer 31. In other words, the first source electrode 34 is positioned between the first semiconductor layer 31 and the first substrate 10. The first control electrode 32 is positioned between the first semiconductor layer 31 and the first substrate 10.

The first drain electrode 33 is an electrode pad located at the backside of the first semiconductor layer 31. In other words, the first drain electrode 33 is positioned between the first semiconductor layer 31 and the second substrate 20 in the Z-direction. The first drain electrode 33 may cover substantially the entire backside of the first semiconductor layer 31. The area of the first drain electrode 33 is greater than the area of the first source electrode 34. The area of the first source electrode 34 is greater than the area of the first control electrode 32.

The first source electrode 34 is electrically connected with a portion (a first conductive region 111) of the first conductive layer 11 via a connection conductive layer 91 (e.g., solder). The connection conductive layer 91 contacts the first source electrode 34 and the first conductive region 111.

The first control electrode 32 is electrically connected with another portion (a second conductive region 112) of the first conductive layer 11 via a connection conductive layer 92. The connection conductive layer 92 contacts the first control electrode 32 and the second conductive region 112.

The second semiconductor element 40 is located between the second substrate 20 and the first semiconductor element 30 in the Z-direction. The second semiconductor element 40 includes a switching element, and may be the same semiconductor chip as the first semiconductor element 30.

The second semiconductor element 40 includes a second semiconductor layer 41, a second control electrode 42, a second drain electrode 43 (a third electrode), and a second source electrode 44 (a fourth electrode). The second control electrode 42, the second drain electrode 43, and the second source electrode 44 are electrically connected respectively with a gate, a drain, and a source of a transistor formed in the second semiconductor layer 41.

The second control electrode 42 and the second source electrode 44 are electrode pads located at the front side of the second semiconductor layer 41. In other words, the second source electrode 44 is positioned between the second semiconductor layer 41 and the first semiconductor element 30 in the Z-direction. The second control electrode 42 is positioned between the second semiconductor layer 41 and the first semiconductor element 30 in the Z-direction.

The second drain electrode 43 is an electrode pad located at the backside of the second semiconductor layer 41. In other words, the second drain electrode 43 is positioned between the second semiconductor layer 41 and the second substrate 20 in the Z-direction. The second drain electrode 43 may cover substantially the entire backside of the second semiconductor layer 41. The area of the second drain electrode 43 is greater than the area of the second source electrode 44; and the area of the second source electrode 44 is greater than the area of the second control electrode 42.

The second drain electrode 43 is electrically connected with a portion (a third conductive region 211) of the second conductive layer 21 via a connection conductive layer 93. The connection conductive layer 93 contacts the second drain electrode 43 and the third conductive region 211.

The second control electrode 42 is electrically connected with another portion (a fourth conductive region 212) of the second conductive layer 21 via a conductive wire 90. For example, the conductive wire 90 contacts the second control electrode 42 and the fourth conductive region 212.

The connection conductor 50 is located between the first semiconductor element 30 and the second semiconductor element 40 in the Z-direction. The connection conductor 50 electrically connects the first drain electrode 33 and the second source electrode 44.

Specifically, the connection conductor 50 is electrically connected with the first drain electrode 33 via a connection conductive layer 85 (a first connection conductive layer). The connection conductive layer 85 is positioned between the first drain electrode 33 and the connection conductor 50, and contacts the first drain electrode 33 and one end portion 50*a* of the connection conductor 50.

The connection conductor 50 is electrically connected with the second source electrode 44 via a connection conductive layer 86 (a second connection conductive layer). The connection conductive layer 86 is positioned between the second source electrode 44 and the connection conductor 50, and contacts the second source electrode 44 and another end portion 50*b* of the connection conductor 50. The connection conductor 50 is one continuous conductive member from the one end portion 50*a* to the other end portion 50*b*. The connection conductor 50 is formed of the same material from the one end portion 50*a* to the other end portion 50*b*.

The sealing part 70 covers a portion of the first substrate 10, a portion of the second substrate 20, the first semiconductor element 30, the second semiconductor element 40, and a portion of the connection conductor 50. The sealing part 70 covers the side surface (the surface along the Z-direction) and the second surface 10*b* of the first substrate 10. The sealing part 70 does not cover the first surface 10*a* of the first substrate 10. In other words, the first surface 10*a* is not covered with the sealing part 70. The sealing part 70 also covers the side surface and the fourth surface 20*b* of the second substrate 20. The sealing part 70 does not cover the third surface 20*a* of the second substrate 20. In other words, the third surface 20*a* is not covered with the sealing part 70.

As illustrated in FIG. 2, the first substrate 10 further includes a third conductive layer 13. The third conductive layer 13 is located at a back surface 12*b* of the first insulating substrate 12 at the side opposite to the front surface 12*a*. The third conductive layer 13 is positioned at the first surface 10*a* of the first substrate 10. That is, the third conductive layer 13 is not covered with the sealing part 70.

Similarly, the second substrate 20 further includes a fourth conductive layer 23. The fourth conductive layer 23 is located at a back surface 22*b* of the second insulating substrate 22 at the side opposite to the front surface 22*a*. The fourth conductive layer 23 is positioned at the third surface 20*a* of the second substrate 20. That is, the fourth conductive layer 23 is not covered with the sealing part 70.

Although the first semiconductor element 30 (a transistor Tr1) and the second semiconductor element 40 (a transistor Tr2) are MOSFETs in the example, the first semiconductor element 30 and the second semiconductor element 40 are not limited to MOSFETs and may be, for example, IGBTs. When IGBTs are used, the control electrode, source electrode, and drain electrode of the MOSFET described above are respectively the gate electrode, emitter electrode, and collector electrode of the IGBT.

Thus, the semiconductor device 100 according to the embodiment is, for example, a device packaged so that two substrates have semiconductor elements mounted with the drains (the collectors) down and the sources (the emitters) down; one of the substrates is flipped; a metal connector is interposed between the two substrates; and double-sided cooling can be performed.

The semiconductor device 100 further includes a first terminal 61, a second terminal 62, a first signal terminal 81, and a second signal terminal 82.

The first terminal 61 electrically connected with the first conductive layer 11 (the first conductive region 111) via a connection conductive layer 97. As a result, the first terminal 61 is electrically connected with the first source electrode 34 via the first conductive layer 11. The first terminal 61 protrudes from a first side surface 70*a* of the sealing part 70.

Specifically, the first terminal 61 includes a first end portion 61*a*, and a first terminal part 61*b* extending from the first end portion 61*a*. The first end portion 61*a* overlaps the first conductive layer 11 and the connection conductive layer 97 in the Z-direction. The first terminal part 61*b* extends in a first extension direction D1 from the first side surface 70*a* of the sealing part 70.

The second terminal 62 is electrically connected with the second conductive layer 21 (the third conductive region 211) via a connection conductive layer 98. As a result, the second terminal 62 is electrically connected with the second drain electrode 43 via the second conductive layer 21. The second terminal 62 protrudes from the first side surface 70*a* of the sealing part 70.

Specifically, the second terminal 62 includes a second end portion 62*a*, and a second terminal part 62*b* extending from the second end portion 62*a*. The second end portion 62*a* overlaps the second conductive layer 21 and the connection conductive layer 98 in the Z-direction. The second terminal part 62*b* extends in the first extension direction D1 from the first side surface 70*a* of the sealing part 70.

The first terminal 61 and the second terminal 62 overlap each other in the Z-direction. The first terminal 61 is arranged with the first semiconductor element 30 in the X-direction. The second terminal 62 is arranged with the second semiconductor element 40 in the X-direction.

The first signal terminal 81 is electrically connected with the first conductive layer 11 (the second conductive region 112) via a connection conductive layer 95. As a result, the first signal terminal 81 is electrically connected with the first control electrode 32 via the first conductive layer 11. The first signal terminal 81 protrudes from a second side surface 70*b* of the sealing part 70.

Specifically, the first signal terminal 81 includes an end portion 81*a*, and a first signal terminal part 81*b* extending from the end portion 81*a*. The end portion 81*a* overlaps the first conductive layer 11 and the connection conductive layer 95 in the Z-direction. The first signal terminal part 81*b* extends in a second extension direction D2 from the second side surface 70*b* of the sealing part 70.

The second side surface 70*b* is at the side opposite to the first side surface 70*a* of the sealing part 70. The first extension direction D1 and the second extension direction D2 are directions in the X-Y plane. The first extension direction D1 and the second extension direction D2 are directions having mutually-opposite orientations. In the example, the second extension direction D2 is parallel to the X-direction.

The second signal terminal 82 is electrically connected with the second conductive layer 21 (the fourth conductive region 212) via a connection conductive layer 96. As a result, the second signal terminal 82 is electrically connected with the second control electrode 42 via the fourth conductive region 212 and the conductive wire 90. The second signal terminal 82 protrudes from the second side surface 70*b* of the sealing part 70.

Specifically, the second signal terminal 82 includes an end portion 82*a*, and a second signal terminal part 82*b* extending from the end portion 82*a*. The end portion 82*a* overlaps the second conductive layer 21 and the connection conductive layer 96 in the Z-direction. The second signal terminal part 82*b* extends in the second extension direction D2 from the second side surface 70*b* of the sealing part 70.

The connection conductor 50 includes a connector part 51, and a third terminal part 53 extending from the connector part 51. The connector part 51 is positioned between the first semiconductor element 30 and the second semiconductor element 40. The connector part 51 contacts the connection conductive layers 85 and 86. The third terminal part 53 extends in the second extension direction D2 from the second side surface 70*b* of the sealing part 70.

The connector part 51 and the third terminal part 53 are continuous with each other. The connector part 51 and the third terminal part 53 are one continuous conductive member. The connector part 51 and the third terminal part 53 are formed of the same material. The third terminal part 53 is a portion of the connection conductor 50 formed to be thinner than the connector part 51. In other words, the thickness (the length along the Z-direction) of the third terminal part 53 is less than the thickness of the connector part 51. In the example of FIG. 2, the third terminal part 53 is separated from the connection conductive layer 86 and the second semiconductor element 40, and contacts the connection conductive layer 85.

The third terminal part 53 is positioned between the first signal terminal 81 and the second signal terminal 82 in the Z-direction. The third terminal part 53 overlaps the first and second signal terminals 81 and 82 in the Z-direction.

Examples of materials of components of the semiconductor device 100 will now be described.

The first insulating substrate 12 and the second insulating substrate 22 each are, for example, ceramic substrates including electrically insulating ceramic materials. The materials of the first insulating substrate 12 and the second insulating substrate 22 include, for example, at least one of aluminum oxide, silicon nitride, or aluminum nitride.

The materials of the first conductive layer 11, the second conductive layer 21, the third conductive layer 13, and the fourth conductive layer 23 include, for example, metal materials such as copper, aluminum, etc.

The connection conductive layers (the connection conductive layers 85, 86, 91, 92, 93, 95, 96, 97, and 98) are, for example, conductive bonding members or adhesives. Specifically, the connection conductive layers can include solder or a silver paste.

The first semiconductor layer 31 and the second semiconductor layer 41 each are, for example, semiconductor substrates including semiconductor materials. Examples of the semiconductor material include, for example, silicon, silicon carbide, gallium nitride, or gallium arsenide. When silicon is used as the semiconductor material, arsenic, phosphorus, or antimony can be used as an n-type impurity. Boron can be used as a p-type impurity.

Materials of the electrodes (the first drain electrode 33, the first source electrode 34, the first control electrode 32, the second drain electrode 43, the second source electrode 44, and the second control electrode 42) include, for example, metal materials such as aluminum, nickel, gold, silver, copper, etc.

The materials of the first terminal 61, the second terminal 62, the first signal terminal 81, and the second signal terminal 82 include, for example, metal materials such as copper, aluminum, etc.

The material of the connection conductor 50 includes, for example, a metal material such as copper, aluminum, etc.

The material of the sealing part 70 is, for example, an epoxy resin, etc.

The material of the conductive wire includes, for example, a metal material of at least one of gold, copper, silver, or aluminum.

An example of operations of the semiconductor device 100 will now be described.

For example, the semiconductor device 100 can be used in a portion of a power conversion circuit such as an inverter circuit, a bridge circuit, etc. For example, a positive voltage with respect to the first terminal 61 is applied to the second terminal 62; and an external load (not illustrated) is connected to the third terminal part 53.

The transistor Tr1 of the first semiconductor element 30 (see FIG. 3) is switched on and off by a signal input to the first signal terminal 81, i.e., the voltage of the first signal terminal 81 with respect to the first source electrode 34. When the voltage of the first signal terminal 81 with respect to the first source electrode 34 exceeds a threshold voltage, the transistor Tr1 is switched on. As a result, for example, an on-current of the transistor Tr1 flows from the third terminal part 53 toward the first terminal 61 via the first drain electrode 33, the first semiconductor layer 31, the first source electrode 34, and the first conductive layer 11 (the first conductive region 111). When the voltage of the first signal terminal 81 with respect to the first source electrode 34 is not more than the threshold voltage, the transistor Tr1 is switched off, and the on-current does not flow.

The transistor Tr2 of the second semiconductor element 40 (see FIG. 3) is switched on and off by a signal input to the second signal terminal 82, i.e., the voltage of the second signal terminal 82 with respect to the second source electrode 44. When the voltage of the second signal terminal 82 with respect to the second source electrode 44 exceeds a threshold voltage, the transistor Tr2 is switched on. As a result, for example, the on-current of the transistor Tr2 flows from the second terminal 62 toward the third terminal part 53 via the second conductive layer 21 (the third conductive region 211), the second drain electrode 43, the second semiconductor layer 41, and the second source electrode 44. When the voltage of the second signal terminal 82 with respect to the second source electrode 44 is not more than the threshold voltage, the transistor Tr2 is switched off, and the on-current does not flow.

For example, in the state in which the transistor Tr2 is on and the transistor Tr1 is off, the on-current of the transistor Tr2 flows from the second terminal 62 toward the third terminal part 53. Subsequently, for example, when the transistor Tr2 is switched from on to off, the current flowing in the external load flows from the first terminal 61 toward the third terminal part 53 via a diode di1 (see FIG. 3). The diode di1 is, for example, a body diode formed of a p-n junction located in the first semiconductor layer 31.

Subsequently, for example, when switched to a state in which the transistor Tr2 is off and the transistor Tr1 is on, the on-current of the transistor Tr1 flows from the third terminal part 53 toward the first terminal 61. When the transistor Tr1 is switched from on to off, the current flowing in the external load flows from the third terminal part 53 toward the second terminal 62 via a diode di2 (see FIG. 3). The diode di2 is, for example, a body diode formed of a p-n junction located in the second semiconductor layer 41.

In the semiconductor device 100, the first source electrode 34 side (or the emitter electrode side) of the first semiconductor element 30 is connected to the first conductive layer 11 at the front surface of the first substrate 10. The second drain electrode 43 side (or the collector electrode side) of the second semiconductor element 40 is connected to the second conductive layer 21 at the front surface of the second substrate 20. Such a first semiconductor element 30 and such a second semiconductor element 40 are located between the first substrate 10 and the second substrate 20. The connection conductor 50 is located between the first semiconductor element 30 and the second semiconductor element 40, and electrically connects the first drain electrode 33 and the second source electrode 44. Thus, the first substrate 10, the second substrate 20, the first semiconductor element 30, the second semiconductor element 40, and the connection conductor 50 are stacked in the Z-direction. The semiconductor device 100 can be smaller thereby. The area in the X-Y plane of the semiconductor device 100 can be small compared to the configuration of a reference example in which, for example, the semiconductor elements are arranged in the X-Y plane (in a plane parallel to the substrate surfaces).

By making the semiconductor device 100 smaller, the path through which the on-current of the first semiconductor element 30 flows between the first terminal 61 and the third terminal part 53 can be shortened. Also, the path through which the on-current of the second semiconductor element 40 flows between the second terminal 62 and the third terminal part 53 can be shortened. The on-resistances of the first and second semiconductor elements 30 and 40 can be reduced.

The first surface 10*a* of the first substrate 10 and the third surface 20*a* of the second substrate 20 are not covered with the sealing part 70. As a result, the heat that is generated when the semiconductor device 100 operates can be dissipated from the two surfaces of the first and third surfaces 10*a* and 20*a*. For example, the heat dissipation performance per unit area in the X-Y plane can be improved. For example, the electrical characteristics can be improved while suppressing degradation of the heat dissipation performance and making the semiconductor device 100 smaller.

The first substrate 10 includes the third conductive layer 13 positioned at the first surface 10*a*. The second substrate 20 includes the fourth conductive layer 23 positioned at the third surface 20*a*. In other words, the third conductive layer 13 and the fourth conductive layer 23 are not covered with the sealing part 70. For example, the heat dissipation performance can be improved thereby. For example, the stress caused by the thermal expansion coefficient difference between the first conductive layer 11 and the first insulating substrate 12 is relaxed by the stress caused by the thermal expansion coefficient difference between the third conductive layer 13 and the first insulating substrate 12. For example, the warp of the first substrate 10 can be suppressed thereby. Similarly, for example, the warp of the second substrate 20 can be suppressed. For example, the material of the third conductive layer 13 may be the same as the material of the first conductive layer 11. The thickness of the third conductive layer 13 may be equal to the thickness of the first conductive layer 11. The material of the fourth conductive layer 23 may be the same as the material of the second conductive layer 21. The thickness of the fourth conductive layer 23 may be equal to the thickness of the second conductive layer 21.

As described with reference to FIG. 2, the connection conductor 50 is one continuous conductive member from the one end portion 50*a* to the other end portion 50*b*. That is, between the first semiconductor element 30 and the second semiconductor element 40, a spacer other than the connection conductor 50 (and the connection conductive layers 85 and 86 for connecting the connection conductor 50) is not provided. For example, a spacer for controlling the distance between the first semiconductor element 30 and the second semiconductor element 40 is not provided. As a result, for example, the Z-direction length of the semiconductor device 100 can be suppressed, and the semiconductor device 100 can be even smaller. For example, by shortening the path of the on-current described above, the on-resistance and heat generation can be suppressed.

The first terminal 61 (the first terminal part 61*b*) and the second terminal 62 (the second terminal part 62*b*) extend in the first extension direction D1 from the first side surface 70*a* of the sealing part 70. On the other hand, the third terminal part 53 extends in the second extension direction D2 from the second side surface 70*b* of the sealing part 70. In other words, the third terminal part 53 is separated from the first terminal part 61*b*. For example, the capacitance between the third terminal part 53 and the first terminal part 61*b* can be suppressed thereby. For example, when the current flows from the third terminal part 53 toward the first terminal 61, the orientation of the current flowing into the third terminal part 53 and the orientation of the current flowing out of the first terminal 61 are the same. For example, the current flows along one direction in the X-Y plane. For example, the inductance can be suppressed thereby.

As illustrated in FIG. 2, the third terminal part 53 is arranged with the second control electrode 42 in the Z-direction. A distance L1 along the Z-direction between the third terminal part 53 and the second semiconductor element 40 is greater than a distance L2 along the Z-direction between the third terminal part 53 and the first semiconductor element 30. Because the distance L1 is relatively long, for example, the space in which the conductive wire 90 is disposed is easily ensured.

As illustrated in FIG. 4, the first conductive layer 11 includes the first conductive region 111, the second conductive region 112, and a conductive region 113 arranged to be separated from each other. The conductive region 113 is electrically connected with an electrode 36 provided in the first semiconductor element 30. The electrode 36 is arranged with the first control electrode 32 in the Y-direction on the front surface of the first semiconductor element 30. For example, the electrode 36 is electrically connected with the first source electrode 34 of the first semiconductor element 30 by a not-illustrated wiring path. A signal terminal 83 that extends in the second extension direction D2 from the conductive region 113 is electrically connected to the conductive region 113. The signal terminal 83 is electrically connected with the first source electrode 34 via the conductive region 113 and the electrode 36. The signal terminal 83 is, for example, a source sense terminal for detecting the current flowing in the first source electrode 34.

The Y-direction length of the first conductive region 111 is greater than the Y-direction length of the first semiconductor element 30, the Y-direction length of the first terminal 61, and the Y-direction length of the second conductive region 112. The Y-direction length of the first terminal 61 is greater than the Y-direction length of the first source electrode 34, the Y-direction length of the second conductive region 112, and the Y-direction length of the first signal terminal 81.

The first conductive region 111 includes a region 111*a* overlapping the first terminal 61 in the Z-direction, and a region 111*b* overlapping the first source electrode 34 in the Z-direction. The second conductive region 112 includes a region 112*a* overlapping the first control electrode 32 in the Z-direction, and a region 112*b* overlapping the first signal terminal 81 in the Z-direction. The region 111*a*, the region 111*b*, the region 112*a*, and the region 112*b* are arranged in this order in the X-direction.

Thus, terminals such as the first terminal 61, the first signal terminal 81, etc., are connected to the first semiconductor element 30 via the first conductive layer 11 located on the substrate. In such a case, for example, an increase of the Z-direction length of the semiconductor device can be suppressed because the first semiconductor element 30 and the terminals do not overlap in the Z-direction. If the terminals are connected by being overlaid on the electrodes of the semiconductor element, it may be considered to provide a spacer between the semiconductor element and the substrate to ensure space in which the terminals are located.

It is unnecessary to provide such a spacer in the semiconductor device 100. Also, when viewed from the first semiconductor element 30, the signal terminals extend in the opposite direction of the first terminal 61, which is wide. For example, the space in which the signal terminals are disposed is easily ensured thereby.

As illustrated in FIG. 5, the second conductive layer 21 includes the third conductive region 211, the fourth conductive region 212, and a conductive region 213 arranged to be separated from each other. The conductive region 213 is electrically connected with an electrode 46 provided in the second semiconductor element 40 via a conductive wire 99. The electrode 46 is arranged with the second control electrode 42 in the Y-direction on the front surface of the second semiconductor element 40. For example, the electrode 46 is electrically connected with the second source electrode 44 of the second semiconductor element 40 by a not-illustrated wiring path. A signal terminal 84 that extends in the second extension direction D2 from the conductive region 213 is electrically connected to the conductive region 213. The signal terminal 84 is electrically connected with the second source electrode 44 via the conductive region 213, the conductive wire 99, and the electrode 46. The signal terminal 84 is, for example, a source sense terminal for detecting the current flowing in the second source electrode 44.

The Y-direction length of the third conductive region 211 is greater than the Y-direction length of the second semiconductor element 40, the Y-direction length of the second terminal 62, and the Y-direction length of the fourth conductive region 212. The Y-direction length of the second terminal 62 is greater than the Y-direction length of the second source electrode 44, the Y-direction length of the fourth conductive region 212, and the Y-direction length of the second signal terminal 82.

The third conductive region 211 includes a region 211*a* overlapping the second terminal 62 in the Z-direction, and a region 211*b* overlapping the second source electrode 44 in the Z-direction. The fourth conductive region 212 includes a region 212*a* to which the conductive wire 90 electrically connected with the second control electrode 42 is connected, and a region 212*b* overlapping the second signal terminal 82 in the Z-direction. The region 211*a*, the region 211*b*, the region 212*a*, and the region 212*b* are arranged in this order in the X-direction.

Thus, terminals such as the second terminal 62, the second signal terminal 82, etc., are connected to the second semiconductor element 40 via the second conductive layer 21 located on the substrate. In such a case, for example, an increase of the Z-direction length of the semiconductor device can be suppressed because the second semiconductor element 40 and the terminals do not overlap in the Z-direction. When viewed from the second semiconductor element 40, the signal terminals extend in the opposite direction of the second terminal 62, which is wide. For example, the space in which the signal terminals are disposed is easily ensured thereby.

Figure 6A:
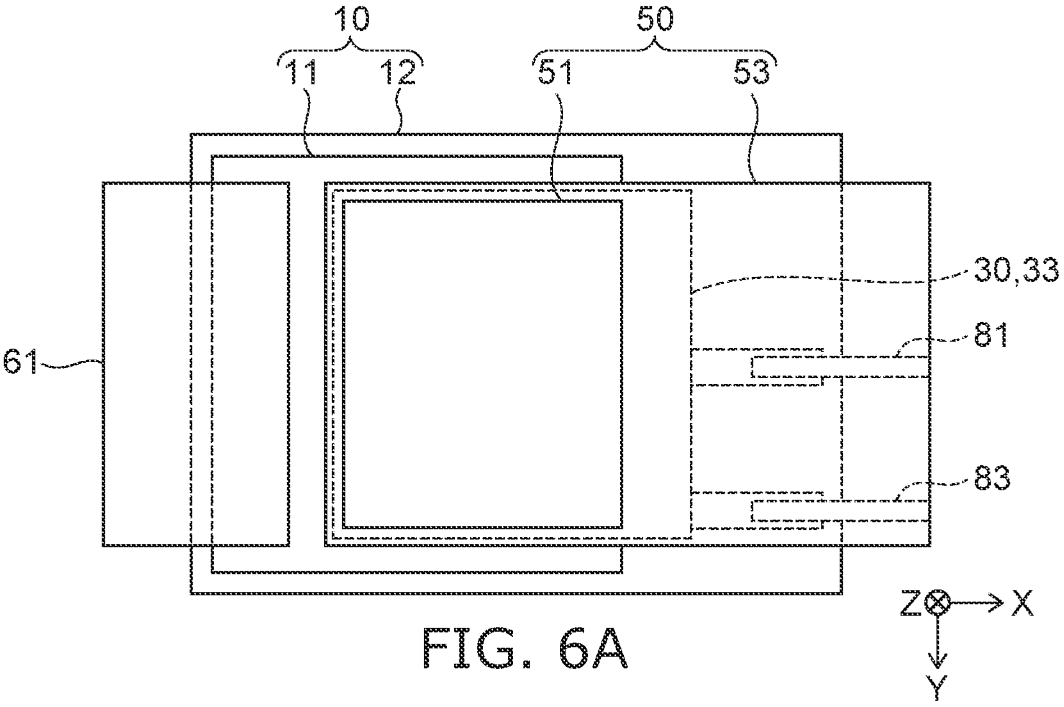
FIGS. 6A and 6B are schematic plan views illustrating portions of the semiconductor device according to the embodiment.
Figure 6B:
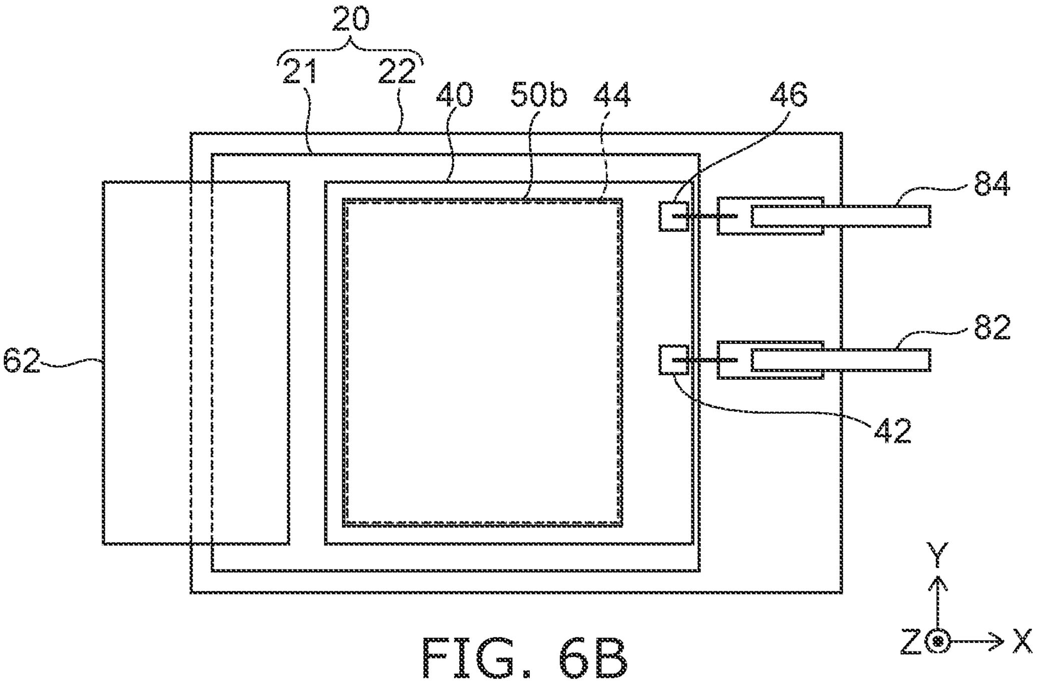

FIGS. 6A and 6B are schematic plan views illustrating portions of the semiconductor device according to the embodiment.

FIG. 6A is a plan view of the portion of the semiconductor device 100 on the first substrate 10 side of line A7-A8 shown in FIG. 2, when viewed along the Z-direction. FIG. 6B is a plan view of the portion of the semiconductor device 100 on the second substrate 20 side of line A7-A8 shown in FIG. 2, when viewed along the opposite direction of the Z-direction.

As illustrated in FIG. 6A, for example, the connection conductor 50 overlaps substantially the entire first semiconductor element 30 (the first drain electrode 33) in the Z-direction. The Y-direction length of the connection conductor 50 is, for example, equal to the Y-direction length of the first semiconductor element 30. The third terminal part 53 of the connection conductor 50 overlaps multiple signal terminals (the first signal terminal 81 and the signal terminal 83) in the Z-direction. The Y-direction length of the third terminal part 53 may be equal to the Y-direction width of the first terminal 61.

As illustrated in FIG. 6B, for example, the end portion (the other end portion 50*b*) of the connection conductor 50 at the second semiconductor element 40 side overlaps substantially the entire second source electrode 44 of the second semiconductor element 40 in the Z-direction. The X-direction length of the other end portion 50*b* may be, for example, equal to the X-direction length of the second source electrode 44. The Y-direction length of the other end portion 50*b* may be, for example, equal to the Y-direction length of the second source electrode 44. That is, the surface of the connection conductor 50 facing the second semiconductor element 40 is narrower than the surface of the connection conductor 50 facing the first semiconductor element 30. The portion of the connection conductor 50 at the second semiconductor element 40 side is narrow in the X-direction and Y-direction compared to the portion of the connection conductor 50 at the first semiconductor element 30 side.

Embodiments may include the following configurations.

Configuration 1

A semiconductor device, comprising:

a first substrate including a first surface, a second surface at a side opposite to the first surface, a first insulating substrate, and a first conductive layer located at a front surface of the first insulating substrate and positioned at the second surface;

a second substrate including a third surface, a fourth surface at a side opposite to the third surface, a second insulating substrate, and a second conductive layer located at a front surface of the second insulating substrate and positioned at the fourth surface, the first conductive layer being positioned between the first insulating substrate and the second insulating substrate in a first direction, the first direction being from the second substrate toward the first substrate, the second conductive layer being positioned between the first substrate and the second insulating substrate in the first direction;

a first semiconductor element located between the first substrate and the second substrate in the first direction, the first semiconductor element including a first semiconductor layer, a first electrode positioned between the first semiconductor layer and the second substrate in the first direction, a second electrode located between the first semiconductor layer and the first substrate, the second electrode being electrically connected with a portion of the first conductive layer, and a first control electrode located between the first semiconductor layer and the first substrate, the first control electrode being electrically connected with another portion of the first conductive layer;

a second semiconductor element located between the second substrate and the first semiconductor element in the first direction, the second semiconductor element including a second semiconductor layer, a third electrode positioned between the second semiconductor layer and the second substrate, the third electrode being electrically connected with a portion of the second conductive layer, a fourth electrode positioned between the second semiconductor layer and the first semiconductor element in the first direction, and a second control electrode positioned between the second semiconductor layer and the first semiconductor element in the first direction, the second control electrode being electrically connected with another portion of the second conductive layer;

a connection conductor located between the first semiconductor element and the second semiconductor element in the first direction, the connection conductor electrically connecting the first and fourth electrodes; and a sealing part covering a portion of the first substrate, a portion of the second substrate, the first semiconductor element, and the second semiconductor element, the sealing part not covering the first surface of the first substrate and the third surface of the second substrate.

Configuration 2

The device according to Configuration 1, wherein the first insulating substrate includes a back surface at a side opposite to the front surface at which the first conductive layer is located, the first substrate includes a third conductive layer located at the back surface of the first insulating substrate and positioned at the first surface, the second insulating substrate includes a back surface at a side opposite to the front surface at which the second conductive layer is located, and the second substrate includes a fourth conductive layer located at the back surface of the second insulating substrate and positioned at the third surface.

Configuration 3

The device according to Configuration 1 or 2, further comprising:

a first connection conductive layer positioned between the connection conductor and the first electrode, the first connection conductive layer contacting the first electrode and contacting one end portion of the connection conductor; and a second connection conductive layer positioned between the connection conductor and the fourth electrode, the second connection conductive layer contacting the fourth electrode and contacting another end portion of the connection conductor, the connection conductor being one continuous conductive member from the one end portion to the other end portion.

Configuration 4

The device according to any one of Configurations 1 to 3, further comprising:

a first terminal electrically connected with the second electrode via the first conductive layer; and a second terminal electrically connected with the third electrode via the second conductive layer, the first terminal including a first terminal part extending in a first extension direction from a first side surface of the sealing part, the second terminal including a second terminal part extending in the first extension direction from the first side surface of the sealing part, the connection conductor including a connector part positioned between the first semiconductor element and the second semiconductor element, and a third terminal part extending in a second extension direction from a second side surface of the sealing part, the second side surface being at a side opposite to the first side surface, the second extension direction being opposite to the first extension direction.

Configuration 5

The device according to any one of Configurations 1 to 4, further comprising:

a first terminal electrically connected with the second electrode via the first conductive layer; and a first signal terminal electrically connected with the first control electrode via the first conductive layer, the first conductive layer including a first conductive region, and a second conductive region separated from the first conductive region and the first conductive region including a region overlapping the first terminal in the first direction, and a region overlapping the second electrode in the first direction, the second conductive region including a region overlapping the first control electrode in the first direction, and a region overlapping the first signal terminal in the first direction.

Configuration 6

The device according to any one of Configurations 1 to 5, further comprising:

a second terminal electrically connected with the third electrode via the second conductive layer; and a second signal terminal electrically connected with the second control electrode via the second conductive layer, the second conductive layer including a third conductive region, and a fourth conductive region separated from the third conductive region, the fourth conductive region not overlapping the second semiconductor element in the first direction, the third conductive region including a region overlapping the second terminal in the first direction, and a region overlapping the third electrode in the first direction, the fourth conductive region including a region to which a conductive wire is connected, the conductive wire being electrically connected with the second control electrode, and a region overlapping the second signal terminal in the first direction.

Configuration 7

The device according to Configuration 6, wherein the connection conductor includes:

a connector part positioned between the first semiconductor element and the second semiconductor element in the first direction; and a third terminal part extending in a second extension direction from the connector part, the third terminal part is arranged with the second control electrode in the first direction, and a distance along the first direction between the third terminal part and the second semiconductor element is greater than a distance along the first direction between the third terminal part and the first semiconductor element.

According to embodiments, a smaller semiconductor device can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel. In this specification, being "electrically connected" includes not only the case of being connected in direct contact, but also the case of being connected via another conductive member, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:

a first substrate including
- a first surface,
- a second surface at a side opposite to the first surface,
- a first insulating substrate, and
- a first conductive layer located at a front surface of the first insulating substrate and positioned at the second surface;

a second substrate including
- a third surface,
- a fourth surface at a side opposite to the third surface,
- a second insulating substrate, and
- a second conductive layer located at a front surface of the second insulating substrate and positioned at the fourth surface, the first conductive layer being positioned between the first insulating substrate and the second insulating substrate in a first direction, the first direction being from the second substrate toward the first substrate, the second conductive layer being positioned between the first substrate and the second insulating substrate in the first direction;

a first semiconductor element located between the first substrate and the second substrate in the first direction, the first semiconductor element including
- a first semiconductor layer,
- a first electrode positioned between the first semiconductor layer and the second substrate in the first direction,
- a second electrode located between the first semiconductor layer and the first substrate, the second electrode being electrically connected with a portion of the first conductive layer, and
- a first control electrode located between the first semiconductor layer and the first substrate, the first control electrode being electrically connected with another portion of the first conductive layer;

a second semiconductor element located between the second substrate and the first semiconductor element in the first direction, the second semiconductor element including
- a second semiconductor layer,
- a third electrode positioned between the second semiconductor layer and the second substrate, the third electrode being electrically connected with a portion of the second conductive layer,
- a fourth electrode positioned between the second semiconductor layer and the first semiconductor element in the first direction, and
- a second control electrode positioned between the second semiconductor layer and the first semiconductor element in the first direction, the second control electrode being electrically connected with another portion of the second conductive layer;

a connection conductor located between the first semiconductor element and the second semiconductor element in the first direction, the connection conductor electrically connecting the first and fourth electrodes; and a sealing part covering a portion of the first substrate, a portion of the second substrate, the first semiconductor element, and the second semiconductor element, the sealing part not covering the first surface of the first substrate and the third surface of the second substrate.

2. The device according to claim 1, wherein the first insulating substrate includes a back surface at a side opposite to the front surface at which the first conductive layer is located, the first substrate includes a third conductive layer located at the back surface of the first insulating substrate and positioned at the first surface, the second insulating substrate includes a back surface at a side opposite to the front surface at which the second conductive layer is located, and the second substrate includes a fourth conductive layer located at the back surface of the second insulating substrate and positioned at the third surface.

3. The device according to claim 1, further comprising:

a first connection conductive layer positioned between the connection conductor and the first electrode, the first connection conductive layer contacting the first electrode and contacting one end portion of the connection conductor; and a second connection conductive layer positioned between the connection conductor and the fourth electrode, the second connection conductive layer contacting the fourth electrode and contacting another end portion of the connection conductor, the connection conductor being one continuous conductive member from the one end portion to the other end portion.

4. The device according to claim 1, further comprising:

a first terminal electrically connected with the second electrode via the first conductive layer; and a second terminal electrically connected with the third electrode via the second conductive layer, the first terminal including a first terminal part extending in a first extension direction from a first side surface of the sealing part, the second terminal including a second terminal part extending in the first extension direction from the first side surface of the sealing part, the connection conductor including a connector part positioned between the first semiconductor element and the second semiconductor element, and a third terminal part extending in a second extension direction from a second side surface of the sealing part, the second side surface being at a side opposite to the first side surface, the second extension direction being opposite to the first extension direction.

5. The device according to claim 1, further comprising:

a first terminal electrically connected with the second electrode via the first conductive layer; and a first signal terminal electrically connected with the first control electrode via the first conductive layer, the first conductive layer including a first conductive region, and a second conductive region separated from the first conductive region and the first conductive region including a region overlapping the first terminal in the first direction, and a region overlapping the second electrode in the first direction, the second conductive region including a region overlapping the first control electrode in the first direction, and a region overlapping the first signal terminal in the first direction.

6. The device according to claim 1, further comprising:

a second terminal electrically connected with the third electrode via the second conductive layer; and a second signal terminal electrically connected with the second control electrode via the second conductive layer, the second conductive layer including a third conductive region, and a fourth conductive region separated from the third conductive region, the fourth conductive region not overlapping the second semiconductor element in the first direction, the third conductive region including a region overlapping the second terminal in the first direction, and a region overlapping the third electrode in the first direction, the fourth conductive region including a region to which a conductive wire is connected, the conductive wire being electrically connected with the second control electrode, and a region overlapping the second signal terminal in the first direction.

7. The device according to claim 6, wherein the connection conductor includes:

a connector part positioned between the first semiconductor element and the second semiconductor element in the first direction; and a third terminal part extending in a second extension direction from the connector part, the third terminal part is arranged with the second control electrode in the first direction, and a distance along the first direction between the third terminal part and the second semiconductor element is greater than a distance along the first direction between the third terminal part and the first semiconductor element.

* * * * *